United States Patent
Alt et al.

(10) Patent No.: US 6,628,141 B1
(45) Date of Patent: Sep. 30, 2003

(54) INTEGRATED CIRCUIT HAVING A SCAN REGISTER CHAIN

(75) Inventors: Jürgen Alt, Höhenkirchen (DE); Marc-Pascal Bringmann, Oxfordshire (GB); Peter Muhmenthaler, München (DE)

(73) Assignee: Infineon Technologies AG, Munich (DE)

( * ) Notice: Subject to any disclaimer, the term of this patent is extended or adjusted under 35 U.S.C. 154(b) by 460 days.

(21) Appl. No.: 09/711,010

(22) Filed: Nov. 13, 2000

Related U.S. Application Data

(63) Continuation of application No. PCT/DE99/01380, filed on May 6, 1999.

(30) Foreign Application Priority Data

May 12, 1998 (DE) .......................................... 198 21 230

(51) Int. Cl.$^7$ .................... H03K 19/173; G01R 31/317
(52) U.S. Cl. ............................ 326/46; 326/16; 714/725
(58) Field of Search ............................. 326/46, 37, 39, 326/40, 16; 714/725, 726, 727, 729

(56) References Cited

U.S. PATENT DOCUMENTS

| | | | |
|---|---|---|---|
| 5,281,864 A | * | 1/1994 | Hahn et al. ................. 327/202 |
| 5,331,643 A | | 7/1994 | Smith |
| 5,352,940 A | * | 10/1994 | Watson ........................ 326/44 |

FOREIGN PATENT DOCUMENTS

EP        0 852 354 A1        7/1998

OTHER PUBLICATIONS

Anonymous: "Built–In Self–Test Of Arrays Embedded In Logic Chips", *IBM Technical Disclosure Bulletin*, vol. 33, No. 1B, Jun. 1990, pp. 306–309.

* cited by examiner

*Primary Examiner*—Daniel Chang
*Assistant Examiner*—James Cho
(74) *Attorney, Agent, or Firm*—Laurence A. Greenberg; Werner H. Stemer; Gregory L. Mayback

(57) ABSTRACT

An integrated circuit is characterized in that circuit parts contained therein are connected to one another via an interface containing at least one scan register chain. The at least one scan register chain is configured such that data can be input into the scan register chain either via the output terminals of one of the circuit parts or via the input and/or output terminals of the integrated circuit. In addition, data can be output from the scan register chain either at the input terminals of one of the circuit parts or at the input and/or output terminals of the integrated circuit.

20 Claims, 3 Drawing Sheets

INTEGRATED CIRCUIT HAVING A SCAN REGISTER CHAIN

CROSS-REFERENCE TO RELATED APPLICATIONS

This is a continuation of copending International Application PCT/DE99/01380, filed May 6, 1999, which designated the United States.

BACKGROUND OF THE INVENTION

Field of the Invention

The present invention relates to an integrated circuit having two or more cooperating circuit sections.

Integrated circuits of this type are, for example, representative of the integrated circuits which experts refer to as "core based systems" or "systems on silicon" or "circuits with embedded macros". In integrated circuits of this type, a first circuit section (core or embedded macro) is embedded in a second circuit section.

An integrated circuit constructed in this way has a first circuit section, a second circuit section, and connecting lines between the first circuit section and the second circuit section.

In this case, the first circuit section is often an existing function block which is "merely" embedded in a new environment (the second circuit section). The use of existing and tested components facilitates the configuration of the relevant integrated circuits. Integrated circuits constructed in this way are comparatively fast and simple to construct.

However, difficulties occasionally arise when testing such integrated circuits, to be precise particularly when the first circuit section and the second circuit section are intended to be tested separately independently of one another.

It is difficult to test the first circuit section separately because in very many cases its input and/or output terminals are, at least in part, accessible only via the surrounding second circuit section. Therefore, it is difficult to test the second circuit section separately because its function is (concomitantly) influenced by the first circuit section embedded in it (by data or signals output from the first circuit section to the second circuit section).

SUMMARY OF THE INVENTION

It is accordingly an object of the invention to provide in an integrated circuit having a scan register chain which overcomes the above-mentioned disadvantages of the prior art devices of this general type, in which the circuit sections can be tested separately and independently of one another with a low outlay under all circumstances.

With the foregoing and other objects in view there is provided, in accordance with the invention, an integrated circuit containing at least two cooperating circuit sections including a first circuit section and a second circuit section, the circuit sections having input terminals and output terminals. An interface containing at least one scan register chain connects the first circuit section to the second circuit section. Input/output terminals are connected to the interface. The scan register chain receives data selectively from the input/output terminals and the output terminals of one of the circuit sections. The data is output selectively from the scan register chain to the input terminals of one of the circuit sections and to the input/output terminals. The scan register chain receives the data output from the output terminals of one of the circuit sections and then outputs the data via the scan register chain to the input/output terminals. The data fed to and stored in the scan register chain from outside the integrated circuit is output to the input terminals of one of the circuit sections.

Accordingly, it is provided that the circuit sections are connected to one another through the interface containing the scan register chain. The scan register chain is configured to the effect that data can be input into the scan register chain optionally via the output terminals of one of the circuit sections or via the input and/or output terminals of the integrated circuit. The data can be output from the scan register chain optionally to the input terminals of one of the circuit sections or to the input and/or output terminals of the integrated circuit.

The provision of one or more scan register chains in the interface between the circuit sections enables direct and complete access to the input and/or output terminals of the respective circuit sections. Data loaded into the scan register chain(s) from outside the integrated circuit can be applied to the input terminals of the respective circuit sections, and data output from the output terminals of the respective circuit sections can be written to the scan register chain(s) and output via the latter from the integrated circuit.

Such access to the input and/or output terminals of the respective circuit sections enables the cooperating circuit sections to be completely decoupled (isolated from one another). Therefore, there is no longer a need or a necessity for the signals or data that are to be input into a circuit section or output therefrom to be conducted via the other circuit section.

By virtue of the fact that the at least one scan register chain is configured to the effect that data can be input into the scan register chain optionally via the output terminals of one of the circuit sections or via the input and/or output terminals of the integrated circuit, and/or that data can be output from the scan register chain optionally to the input terminals of one of the circuit sections or to the input and/or output terminals of the integrated circuit, the number of scan register chains which is necessary for access to the input and/or output terminals of the respective circuit sections can be kept to a minimum. This is because the at least one scan register chain has a dual function. It can have data that are output from the output terminals of a circuit section written to it and output the data from the integrated circuit, or it can have data written to it from outside the integrated circuit and output these data to the input terminals of a circuit section.

Consequently, an integrated circuit has been found whose circuit sections can be tested separately independently of one another with a low outlay under all circumstances.

In accordance with an added feature of the invention, the interface contains a multiplicity of interface units, one of the interface units is provided for each connection between the first circuit section and the second circuit section.

In accordance with an additional feature of the invention, the interface units each contain a register, the register from each of the interface units are connected up to form the at least one scan register chain.

In accordance with another feature of the invention, the interface units each contain a multiplexer connected upstream of the input terminals of the circuit sections. The multiplexer selectively switches through a signal fed in during normal operation and a further signal to a respective input terminal of the circuit sections.

In accordance with a further feature of the invention, the further signal is output by the register of a respective one of the interface units and the further signal is a signal input through the input/output terminal.

In accordance with a concomitant feature of the invention, the at least one scan register chain is configured to subject a sequence of the data that are input in parallel to a signature analysis.

Other features which are considered as characteristic for the invention are set forth in the appended claims.

Although the invention is illustrated and described herein as embodied in an integrated circuit having a scan register chain, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 3:
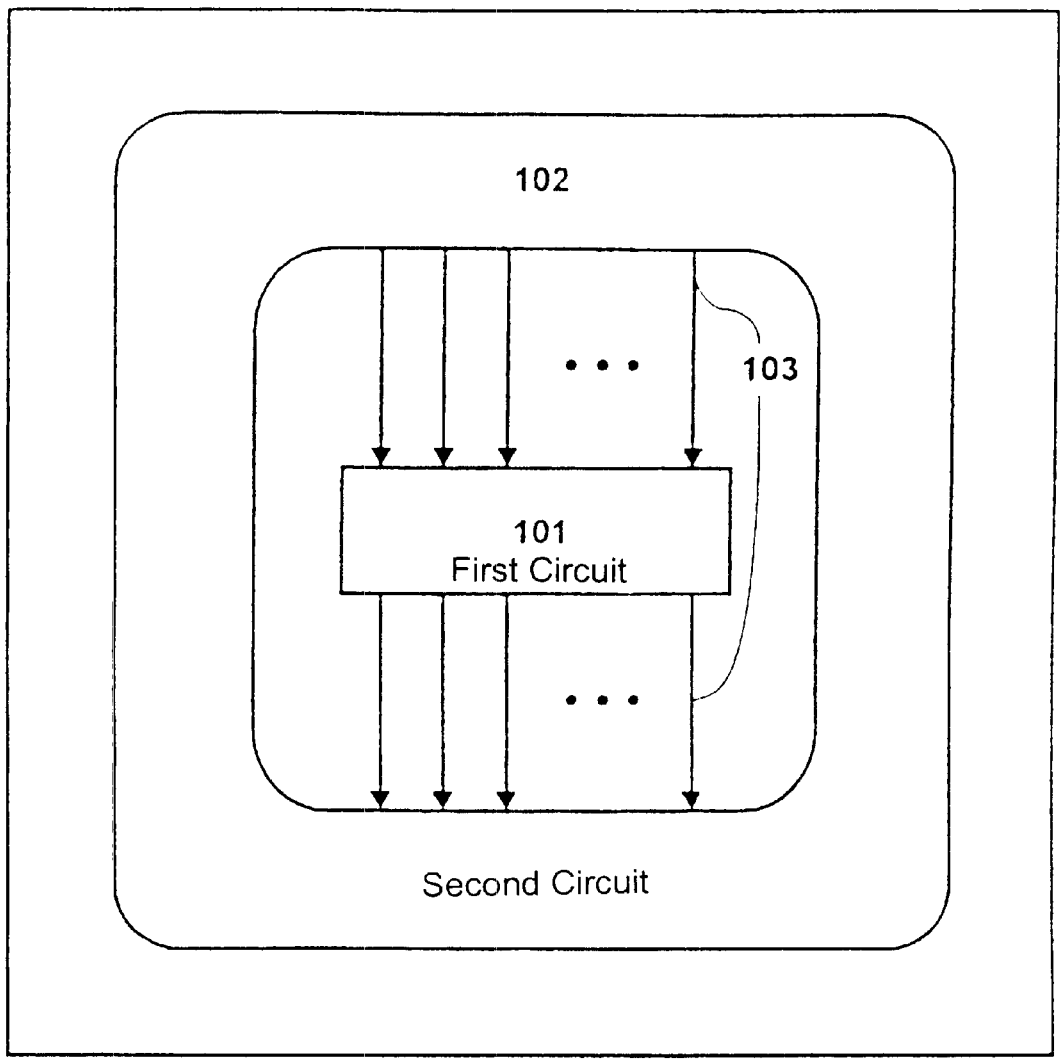
FIG. 3 is a schematic illustration of a structure of a conventional integrated circuit having a plurality of circuit sections.

In all the figures of the drawing, sub-features and integral parts that correspond to one another bear the same reference symbol in each case. Referring now to the figures of the drawing in detail and first, particularly, to FIG. 3 thereof, there is shown a prior art integrated circuit containing a first circuit section 101, a second circuit section 102, and connecting lines 103 between the first circuit section 101 and the second circuit section 102.

However, difficulties occasionally arise when testing such integrated circuits, to be precise particularly when the first circuit section 101 and the second circuit section 102 are intended to be tested separately independently of one another.

The integrated circuit according to the invention that is described in more detail below is representative of integrated circuits which are referred to as "core based systems", "systems on silicon" or "circuits with embedded macros". Although the invention can be used particularly beneficially in such integrated circuits, there is no restriction thereto; the integrated circuit may, in principle, be of any desired type.

In the example considered, the integrated circuit contains two circuit sections. There is no restriction to this either as many more circuit sections as desired may also be provided.

Of the two circuit sections, the first circuit section is embedded at least functionally in the second circuit section. However, there is no restriction to this either; the invention can also be used beneficially in cases where cooperation between the circuit sections present is altered in comparison with this.

In the example considered, one of the circuit sections is an existing and tested function block referred to as a "core" or "macro block". Although the invention can be used particularly beneficially in such cases, there is no restriction to this either; the circuit sections may, in principle, be of any desired type.

Figure 1:
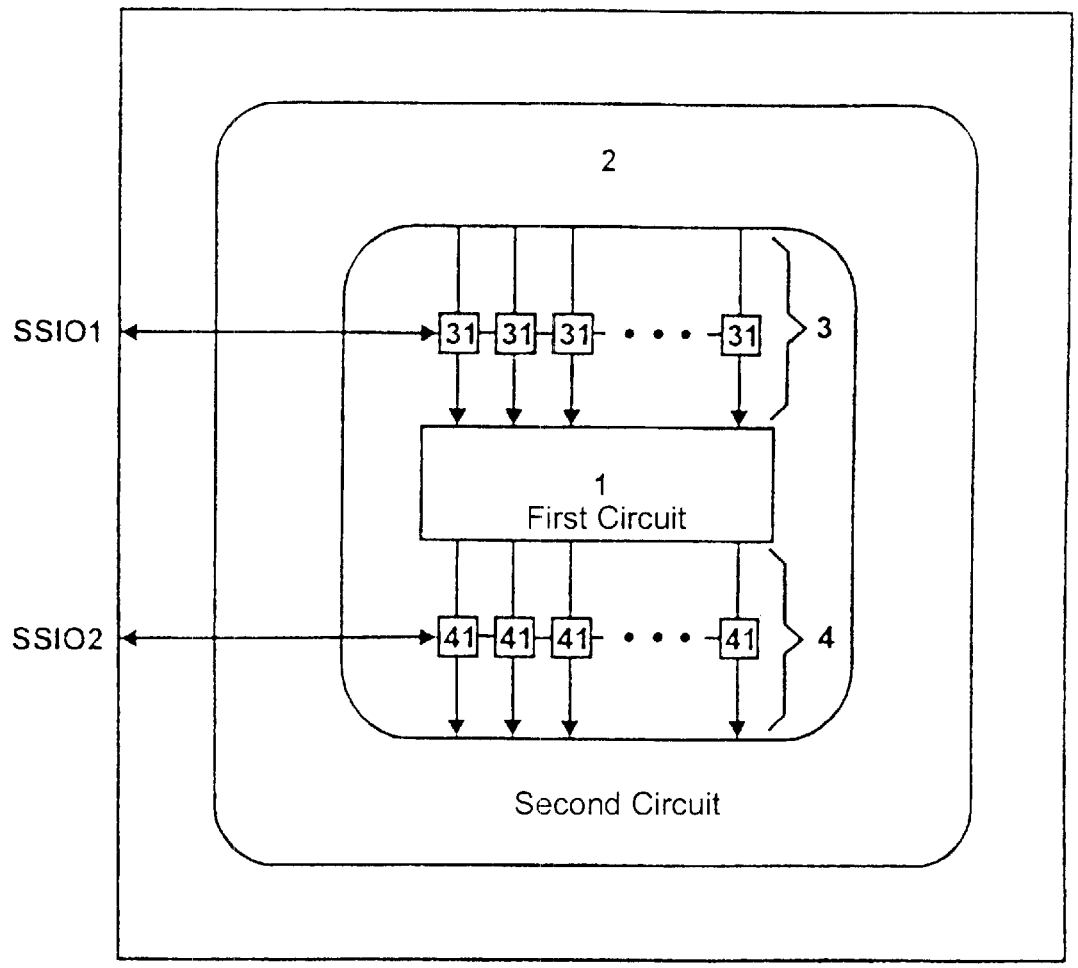
FIG. 1 is a schematic illustration of a structure of an integrated circuit according to the invention.

Turning now to FIG. 1 there is shown an integrated circuit, according to the invention, containing a first circuit section 1 and a second circuit section 2, the first circuit section 1 being embedded in the second circuit section 2. The first circuit section 1 is the macro block already mentioned, and the second circuit section 2 is a (logic) circuit composed of logic modules.

During normal operation, the first circuit section 1 and the second circuit section 2 are connected to one another via connecting paths 3 and 4. The connecting paths 3 serve to transfer signals and/or data from the second circuit section 2 to the first circuit section 1, and the connecting paths 4 serve to transfer signals and/or data from the first circuit section 1 to the second circuit section 2.

The connecting paths 3 contain interface units 31, and the connecting paths 4 contain interface units 41. The interface units 31, 41, which will be described in more detail below, form, in their entirety, an interface that can decouple the first circuit section 1 from the second circuit section 2. As will be understood even better later, this decoupling enables the first and second circuit sections 1, 2 to be tested separately.

The interface units 31 and 41 are connected to input and/or output terminal groups SSIO1 and SSIO2 of the integrated circuit. The signals and/or data which are input and/or output via the input and/or output terminal groups emerge from the description below of structure, function and method of operation of the interface units 31 and 41.

Figure 2:
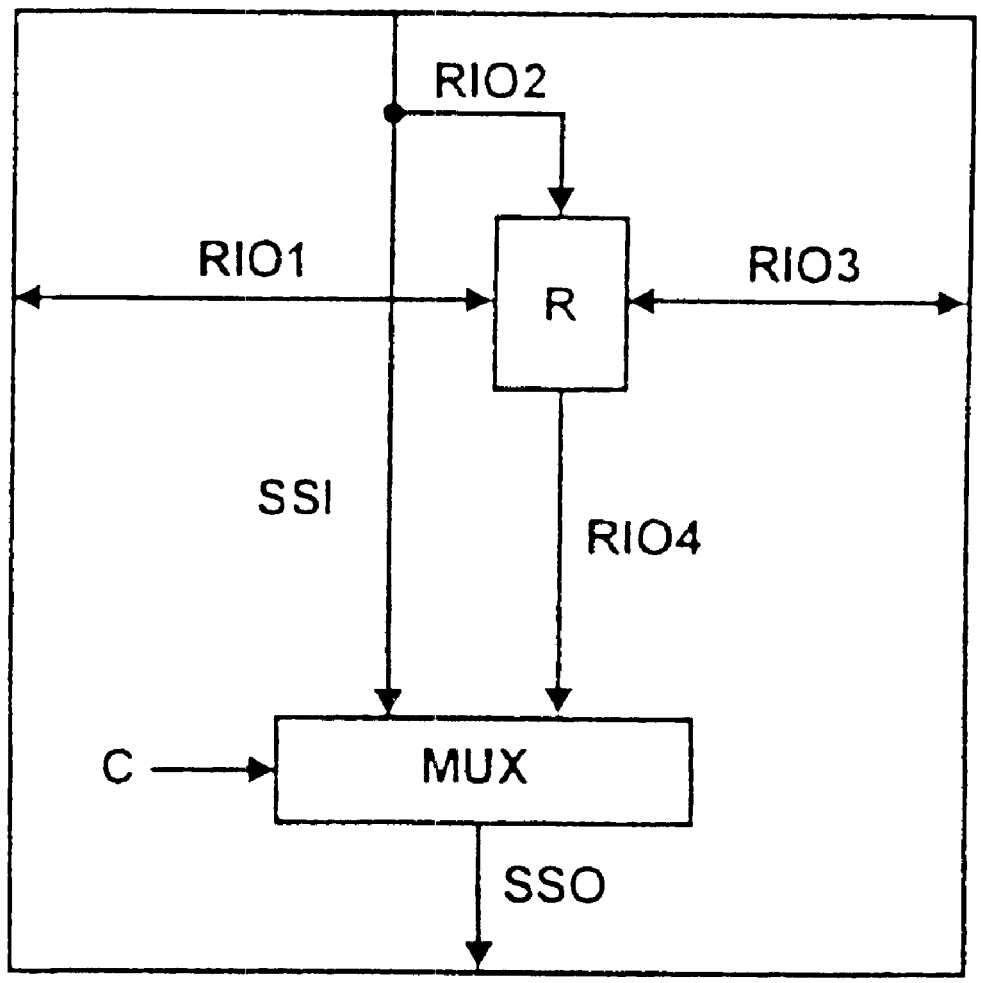
FIG. 2 is a block diagram of a structure of an interface unit of the integrated circuit shown in FIG. 1.

The structure of the interface unit 31 or 41 is illustrated in FIG. 2.

As is evident from FIG. 2, each of the interface units 31 and 41 contains a multiplexer MUX and a register R (formed by a flip-flop, for example), which are connected up as shown.

The multiplexer MUX, which is controlled (by a control signal C), switches through, in the case of the interface unit 31, selectively an output signal of the second circuit section 2, or a signal or datum stored in the register R. In the case of the interface unit 41, the multiplexer selectively switches through an output signal of the first circuit section 1, or the signal or datum stored in the register R. The switched-through signal or datum is used as an input signal for the first circuit section 1 in the case of the interface unit 31, and as an input signal for the second circuit section 2 in the case of the interface unit 41.

The signal or datum input from the first or second circuit section into the interface unit 31 or 41, respectively, is conducted via a line designated by the reference symbol SSI within the interface unit. The signal or datum output from the interface unit 31 or 41 to the first or second circuit section, respectively, is conducted via a line designated by the reference symbol SSO within the interface unit 31, 41.

During normal operation of the integrated circuit, the multiplexer MUX is driven in such a way that in each case the signal or datum output from one circuit section is switched through to the respective other circuit section; the circuit sections can then cooperate as intended.

The multiplexer is caused to switch through the signal or datum stored in the register R "only" when the first or the second circuit section is intended to be tested.

In the example considered, the circuit sections 1, 2 are tested in such a way that specific input signals are input into the circuit section 1, 2 to be tested, and the output signals which are output in response to the input signals from the circuit section to be tested are detected and checked with regard to their correspondence to known desired output signals.

In the example considered, the inputting of the specific input signals and the detection of the output signals resulting therefrom are effected using one or more scan register chains. In the present case, the scan register chain is formed by a corresponding interconnection of the registers R of the interface units 31 and/or of the registers R of the interface units 41. In this case, the registers R are connected up to form one or more scan register chains using the lines designated by the reference symbols RIO1 and RIO3 in FIG. 2.

The scan register chains have connections to specific input and/or output terminals (the input and/or output terminal groups SSIO1 and SSIO2) of the integrated circuit. Using the input and/or output terminals, it is possible, inter alia, for data to be written serially to the scan register chains and for data stored in the scan register chains to be read out serially.

Scan register chains have been known for a long time, so a more detailed description thereof can be dispensed with.

However, the scan register chains used in the example considered are distinguished by a special feature. They are configured to the effect that data can be input into the scan register chain selectively through the output terminals of one of the circuit sections 1, 2 or via the input and/or output terminals SSI01, SSI02 of the integrated circuit, and/or that data can be output from the scan register chain optionally to the input terminals of one of the circuit sections 1, 2 or to the input and/or output terminals SSI01, SSI02 of the integrated circuit.

This can be realized without difficulty by a variable definition of signal paths and/or alterations in the interconnection of the individual registers.

As emerges from the explanations below, the scan register chains can thereby be used for different purposes in each case.

In order to test the first circuit section 1, the below listed steps are performed.

1.1) The scan register chain containing the registers R of the interface units 31 is loaded serially, from outside the integrated circuit, with data that are to be input into the first circuit section 1.

1.2) After the loading operation has ended, the data stored in the registers R of the scan register chain are switched via the multiplexer MUX in parallel to the input terminals of the first circuit section 1.

1.3) The data output in response thereto from the first circuit section 1 to the second circuit section 2 are written via the lines RIO2 in parallel to the registers R of the interface units 41.

1.4) The scan register chain containing the registers R of the interface units 41 is read serially to a point outside the integrated circuit.

1.5) The data read out are compared with desired output data. In the event of correspondence, the first circuit section 1 has operated in a manner free from errors; in the event of no correspondence, an error has occurred.

In order to test the second circuit section 2, the below listed steps are performed.

2.1) The scan register chain containing the registers R of the interface units 41 is loaded serially, from outside the integrated circuit, with the data that are to be input into the second circuit section 2.

2.2) After the loading operation has ended, the data stored in the registers R of the scan register chain are switched via the multiplexer MUX in parallel to the input terminals of the second circuit section 2.

2.3) The data output in response thereto from the second circuit section 2 to the first circuit section 1 are written via the lines RI02 in parallel to the registers R of the interface units 31.

2.4) The scan register chain containing the registers R of the interface units 31 is read serially to a point outside the integrated circuit.

2.5) The data read out are compared with desired output data. In the event of correspondence, the second circuit section 2 has operated in a manner free from errors; in the event of no correspondence, an error has occurred.

Testing the first and second circuit sections 1, 2 in the manner described proves to be advantageous because there is the possibility of direct access, i.e. not via the circuit section that is not to be tested, to the input and/or output terminals SSI01, SSI02 of the circuit section that is to be tested, and during the test, the circuit section that is not to be tested cannot, for lack of corresponding connections to the circuit section to be tested, have any influence on the circuit section that is to be tested.

The measures required for testing the circuit sections 1, 2 in this way require a minimal outlay because the scan register chain containing the registers R of the interface units 31 can be used both for inputting predetermined data into the second circuit section 2 (steps 1.1 and 1.2 mentioned above) and for receiving and forwarding data output from the first circuit section 1 (steps 2.3 and 2.4 mentioned above). And the scan register chain containing the registers R of the interface units 41 can be used both for inputting predetermined data into the second circuit section 2 (steps 2.1 and 2.2 mentioned above) and for receiving and forwarding data output from the first circuit section 1 (steps 1.3 and 1.4 mentioned above).

The test can be carried out even more simply if the registers R of the interface units 31 and 41 are configured as so-called multiple input signature registers (MISRs) or scan register chains configured for signature analysis are used, so that the data output from a respective circuit section can be subjected to a signature analysis. A sequence of parallel data can be compacted by a signature analysis. The result obtained is a signature from which it can be identified whether or not the data sequence output from the assigned circuit section corresponds to a desired data sequence. In this case, although ultimately one arrives in a similar manner at the same result as is the case when normal scan register chains are used, the outlay that has to be committed to do so is distinctly less. This is because scan register chains that are suitable for signature analysis do not have to be read after every single data output of the assigned circuit section, but rather only after a greater or lesser number of data output cycles.

In principle, it is also possible to test the individual circuit sections separately without the use of scan register chains. For this purpose, the input and output terminals of the respective circuit sections "only" have to be connected to the input and/or output terminals of the integrated circuit, in which case, however, the input signals fed in from outside the integrated circuit are not applied directly to the input terminals of the respect circuit sections but to the multiplexers connected upstream of the input terminals. However, the circuit sections can be tested in this way only if the integrated circuit has at least as many input and/or output terminals as the circuit sections to be tested.

Any desired combinations of the test measures presented here can also be used. It is most advantageous if the inputting of data into the circuit section to be tested is effected directly (without the interposition of a scan register chain), directly via the input and/or output terminals of the integrated circuit, and if the signals and/or data output from the relevant circuit section are routed outward via a scan register chain which is configured for carrying out a signature analysis. This enables the relevant circuit section to be tested with minimal outlay the most comprehensively (in real time).

If the input and/or output terminals of the integrated circuit are actually insufficient for this purpose, the inputting of data into the circuit sections to be tested can also be effected via scan register chains. Such testing (already described in detail above) can definitely be carried out in any integrated circuit; it enables any desired circuit sections of any desired integrated circuits to be tested separately independently from one another with a low outlay under all circumstances.

If the above-described interface between the circuit sections is made a fixed part of a respective circuit section, then the circuit section can be used without any adaptation to the given conditions in any desired integrated circuits; such circuit sections are the perfect "cores" or "macro blocks".

We claim:

1. An integrated circuit, comprising:

at least two cooperating circuit sections including a first circuit section and a second circuit section, said circuit sections having input terminals and output terminals;

an interface containing at least one scan register chain connecting said first circuit section to said second circuit section; and input/output terminals connected to said interface, said scan register chain receiving data selectively from said input/output terminals and said output terminals of one of said circuit sections, the data being output selectively from said scan register chain to said input terminals of one of said circuit sections and to said input/output terminals, said scan register chain receiving the data output from said output terminals of one of said circuit sections and then outputting the data via the scan register chain to said input/output terminals, and, the data fed to and stored in said scan register chain from outside the integrated circuit being output to said input terminals of one of said circuit sections.

2. The integrated circuit according to claim 1, wherein said interface contains a multiplicity of interface units, one of said interface units provided for each connection between said first circuit section and said second circuit section.

3. The integrated circuit according to claim 2, wherein said interface units each contain a register, said register from each of said interface units are connected up to form said at least one scan register chain.

4. The integrated circuit according to claim 3, wherein said interface units each contain a multiplexer connected upstream of said input terminals of said circuit sections, said multiplexer selectively switching through a signal fed in during normal operation and a further signal to a respective input terminal of said circuit sections.

5. The integrated circuit according to claim 4, wherein the further signal is output by said register of a respective one of said interface units.

6. The integrated circuit according to claim 4, wherein the further signal is a signal being is input through said input/output terminal.

7. The integrated circuit according to claim 1, wherein said at least one scan register chain is configured to subject a sequence of the data that are input in parallel to a signature analysis.

8. An integrated circuit, comprising:

at least two cooperating circuit sections including a first circuit section and a second circuit section, said circuit sections having input terminals and output terminals;

an interface containing at least one scan register chain connecting said first circuit section to said second circuit section, said interface containing a multiplicity of interface units, one of said interface units provided for each connection between said first circuit section and said second circuit section, said interface units connected upstream of said input terminals of said circuit sections each contain a multiplexer which can selectively switch through a signal fed in during normal operation or a further signal to a respective input terminal of said circuit sections; and input/output terminals connected to said interface, said scan register chain selectively receiving and storing data input through said output terminals of one of said circuit sections or through said input/output terminals, the data being output from said scan register chain selectively to said input terminals of one of said circuit sections or to said input/output terminals.

9. The integrated circuit according to claim 8, wherein said interface units each contain a register, said register from each of said interface units are connected up to form said at least one scan register chain.

10. The integrated circuit according to claim 9, wherein the other signal is an output signal of said register of an associated one of said interface units.

11. The integrated circuit according to claim 8, wherein the further signal is a signal received at said input/output terminals.

12. The integrated circuit according to claim 8, wherein said at least one scan register chain selectively receives and stores the data output from said output terminals of one of said circuit sections and outputs the data via the scan register chain to said input/output terminals, or receives and stores the data received from outside the integrated circuit and the data are output to said input terminals of one of said circuit sections.

13. The integrated circuit according to claim 8, wherein said scan register chain is configured to subject a sequence of the data received in parallel to a signature analysis.

14. An integrated circuit, comprising:

at least two cooperating circuit sections including a first circuit section and a second circuit section, said circuit sections having input terminals and output terminals;

an interface containing at least one scan register chain connecting said first circuit section to said second circuit section; and input/output terminals connected to said interface, said at least one scan register chain receiving data selectively through said output terminals of one of said circuit sections or through said input/output terminals, the data can be output from said scan register chain selectively to said input terminals of one of said circuit sections or to said input/output terminals, and said at least one scan register chain configured to subject a sequence of the data input in parallel to a signature analysis.

15. The integrated circuit according to claim 14, wherein said interface contains a multiplicity of interface units, one of said interface units provided for each connection between said first circuit section and said second circuit section.

16. The integrated circuit according to claim 15, wherein said interface units each contain a register, and said register from each of said interface units are connected up to each other to form said at least one scan register chain.

17. The integrated circuit according to claim 16, wherein said interface units are connected upstream of said input terminals of said circuit sections and each contain a multiplexer which can selectively switch through a signal fed in during normal operation or a further signal to a respective input terminal of said circuit sections.

18. The integrated circuit according to claim 17, wherein the further signal is an output signal of said register of a respective interface unit of said interface units.

19. The integrated circuit according to claim 17, wherein the further signal is a signal which is input through said input/output terminal.

20. The integrated circuit according to claim 14, wherein said at least one scan register chain selectively:

receives the data output from said output terminals of one of said circuit sections and outputs the data to said input/output terminals; or receives and stores the data in said scan register chain from outside the integrated circuit and the data are output to said input terminals of one of said circuit sections.

* * * * *